(12) United States Patent
Mizuhashi

(10) Patent No.: US 7,023,746 B2
(45) Date of Patent: Apr. 4, 2006

(54) HIGH-SPEED SYNCHRONOUS MEMORY DEVICE

(75) Inventor: Hiroshi Mizuhashi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/972,433

(22) Filed: Oct. 26, 2004

(65) Prior Publication Data

US 2005/0105379 A1    May 19, 2005

(30) Foreign Application Priority Data

Nov. 19, 2003  (JP)  ............................. 2003-388714

(51) Int. Cl.
*G11C 7/00*  (2006.01)
(52) U.S. Cl. .................. 365/191; 365/203; 365/233
(58) Field of Classification Search ............... 365/191, 365/203, 233, 190, 202, 222
See application file for complete search history.

(56) References Cited

U.S. PATENT DOCUMENTS 6,333,895 B1 * 12/2001 Hamamoto et al. ......... 365/233
6,377,512 B1 * 4/2002 Hamamoto et al. ......... 365/233
6,552,959 B1 * 4/2003 Yamauchi et al. .......... 365/233

FOREIGN PATENT DOCUMENTS

JP    2001-155485    6/2001

* cited by examiner

*Primary Examiner*—Gene N. Auduong
(74) *Attorney, Agent, or Firm*—Donald R. Studebaker; Nixon Peabody LLP

(57) ABSTRACT

A synchronous semiconductor memory device has a read data bus for transferring data from a memory cell array to a read amplifier, and a write data bus for transferring data from a write driver to the memory cell array. To control equalization of the read and write data buses, an internal control clock signal is driven to a first level in delayed synchronization with an external clock signal, to a second level in synchronization with the external clock signal at the end of write operations, and to the second level in synchronization with a read amplifier control signal during read operations. The read and write data bus equalization times can therefore be separately optimized, enabling the memory to operate at a higher clock frequency than if the internal control clock signal were to be generated in the same way during both read and write operations.

14 Claims, 9 Drawing Sheets

HIGH-SPEED SYNCHRONOUS MEMORY DEVICE

BACKGROUND OF THE INVENTION

1. Field of the Invention

The present invention relates to a synchronous semiconductor memory device capable of operating at a high clock frequency, such as a high-speed synchronous dynamic random access memory (SDRAM).

2. Description of the Related Art

In the reading of data from a memory cell in a high-frequency synchronous semiconductor memory device, and in the writing of data into the memory cell, the data must be reliably transmitted over data transmission lines having a large line capacitance. In particular, when the data transmission lines swing the full distance between the power supply potential (the high logic level) and the ground potential (the low logic level), read access must be preceded by an adequate equalization time.

To enable an adequate equalization time to be obtained at a high clock frequency, Japanese Unexamined Patent Application Publication No. 2001-155485 inserts selector switching elements between the data transmission lines and the input terminals of the preamplifier disposed at the end of the data transmission lines. The data are transmitted as pulses, during which the switching elements are placed in the conducting state or on-state to enable the preamplifier to detect the potential difference on the pair of data transmission lines. At the end of each data pulse, the switching elements are switched off and equalization of the data transmission lines begins. This enables the pair of data transmission lines to be brought to the same potential in preparation for the following read access, despite the large line capacitance and the high clock frequency.

The same problem is addressed in a different way by the conventional synchronous semiconductor memory device shown in FIG. 1, for example, by providing two complementary pairs of data transmission lines: a pair of read data bus lines RDB, RDBb and a pair of write data bus lines WDB, WDBb. This synchronous semiconductor memory device 500 comprises a timing control delay circuit 12, a column control clock generator 502, a column address predecoder 16, a column address decoder 18, a memory cell array 22, a data bus equalization controller 24, a read data bus (RDB) equalizer 504, a write data bus (WDB) equalizer 28, a read amplifier (AMP) controller 30, a read amplifier 506, a write driver controller 36 and a write driver 38. The memory cell array 22 comprises a plurality of memory cells 40, a plurality of sense amplifiers (SA) 42, a plurality of read column selection gates 44, and a plurality of write column selection gates 46. For simplicity, only one memory cell 40, sense amplifier 42, read column selection gate 44, and write column selection gate 46 are shown.

The timing control delay circuit 12 in this synchronous semiconductor memory device 500 delays an external clock signal 102 for a certain time to generate a delayed clock signal 104. Referring to FIG. 2, the column control clock generator 502 includes a pair of timing adjustment delay circuits 602, 606 that slightly delay both clock signals 102, 104. The column control clock generator 502 latches the rising edge of the delayed clock signal 104 in an RS flip-flop 610 comprising a pair of NAND gates 626, 628 to bring a column control clock signal 510 from the low logic level to the high logic level, and outputs the column control clock signal 510 through a pair of inverters 612 and 614. A one-shot pulse generator 608 comprising a buffer 620, an inverter 622, and a NAND gate 624 receives the following rising edge of the clock signal 102, and generates a one-shot pulse that resets the RS flip-flop 610, returning the column control clock signal 510 to the low logic level.

The column control clock signal 510 and a read signal 108 are supplied to the column address decoder 18, data bus equalization controller 24, read amplifier controller 30, and write driver controller 36. The column address predecoder 16 pre-decodes a column address signal 110 and outputs a predecoded address signal 112 to the column address decoder 18. In a read cycle, when the read signal 108 is at the high logic level, the column address decoder 18 generates a read column selection signal 114, and the memory cell data amplified by the sense amplifier 42 are output through bit lines 118, 120 and the read column selection gate 44 to the read data bus lines RDB, RDBb. In a write cycle, when the read signal 108 is at the low logic level, the column address decoder 18 generates a write column selection signal 116, and the data on the write data bus lines WDB, WDBb are written through the write column selection gate 46 and bit lines 118, 120 into a selected memory cell 40.

The data bus equalization controller 24, read amplifier controller 30, and write driver controller 36 control the data buses. The data bus equalization controller 24 generates a read equalization signal 122 and a write equalization signal 124, in response to which the read data bus equalizer 504 and write data bus equalizer 28 equalize the data bus lines. When the read signal 108 is high, the read amplifier controller 30 generates a read amplifier control signal 126 to activate the read amplifier 506, waiting for a certain time from the end of the equalization interval to allow an adequate potential difference to develop on the read data bus lines RDB and RDBb. When the read signal 108 is low, the write driver controller 36 generates a write driver control signal 132 to activate the write driver 38, starting as soon as the equalization interval ends.

The column selection signals 114, 116, the read equalization signal 122, the write equalization signal 124, the read amplifier control signal 126, and the write driver control signal 132 are synchronized to the column control clock signal 510 as shown in FIG. 3. The read equalization signal 122 is active throughout each write cycle, so the read data bus lines RDB, RDBb are thoroughly equalized before the following read cycle. In succeeding read cycles, the read data bus lines are equalized for intervals equal in length to the pulse width of the column control clock signal 510, which is determined solely by the timing control delay circuit 12 and the timing adjustment delay circuits 602, 606 in the column control clock generator 502. The write data bus is similarly equalized throughout read cycles, and for intervals equal in length to the pulse width of the column control clock signal 510 during write cycles. By equalizing the read data bus during write cycles, and the write data bus during read cycles, the synchronous semiconductor memory device 500 can prepare the data buses for reliable data transfer despite the large load presented by the bus lines, the bit lines 118, 120, and the many connected transistors (not shown) in the memory cell array 22.

During a write cycle, the write driver 38 must drive the write data bus lines for an adequate time to write the data through this load into the memory cell 40. The write driver 38 does not require a long equalization time, however, because it simply drives the write data bus lines WDB, WDBb to the necessary logic levels, regardless of whether they have been completely equalized or not.

In a read cycle, however, the read amplifier 506 must first detect a slight potential difference on the read data bus lines and then amplify the difference. This operation requires both an adequate preceding equalization time, to ensure that the potential difference is correctly detected, and an adequate amplification time. In a series of successive read cycles, the equalization time in the second and subsequent cycles is equal to the pulse width of the column control clock signal 510, as noted above. If this pulse width is comparatively short, as shown in FIG. 3, then at high clock frequencies, equalization may become inadequate, leading to possible read errors. If the pulse width of the column control clock signal 510 is lengthened, however, then the interval during which the write driver 38 is activated may is correspondingly shortened, leading to possible write errors.

SUMMARY OF THE INVENTION

A general object of the present invention is to enable a synchronous semiconductor memory device to operate at a high clock frequency.

A more specific object is to optimize the equalization time of the read data bus in a synchronous semiconductor memory device without shortening the driving time of the write data bus.

The invented synchronous semiconductor memory device has a memory cell array including a plurality of memory cells, a pair of read data bus lines, a read column selection gate for selectively connecting the read data bus lines to the memory cell array to receive data stored in the memory cells, a pair of write data bus lines, a write column selection gate for selectively connecting the write data bus lines to the memory cell array to write data into the memory cells, a column selection signal generator for controlling the read and write column selection gates, a read data bus equalizer for equalizing the read data bus lines, a write data bus equalizer for equalizing the write data bus lines, and an equalizing signal generator for controlling the read data bus equalizer and the write data bus equalizer. The synchronous semiconductor memory device also has a read amplifier for amplifying the data on the read data bus lines, a read amplifier controller for controlling the read amplifier, and a column control clock generator for generating a column control clock signal responsive to an externally supplied clock signal and a read amplifier control signal output by the read amplifier controller to control the read amplifier.

The column control clock signal is supplied to the column address decoder and the data bus equalization controller. In response to a transition of the externally supplied clock signal at the conclusion of a write operation, the column control clock signal is preferably driven from a first state to a second state, causing the write column selection gate to disconnect the write data bus from the memory cell array and the data bus equalization controller to start equalizing the write data bus lines. The column control clock signal is also preferably driven from the first state to the second state in response to a transition of the read amplifier control signal that occurs during a read operation, causing the read column selection gate to disconnect the read data bus from the memory cell array and enabling the read data bus equalizer to start equalizing the read data bus lines.

The read amplifier may also generate an amplification completion signal to indicate that amplification of the data on the read data bus has proceeded to a certain point, and disconnect itself from the read data bus at this point. The amplification completion signal may be supplied to the data bus equalization controller or the read data bus equalizer to ensure that equalization does not start before the read amplifier is disconnected from the read data bus lines.

By generating the column control clock signal in different ways during read operations and write operations, the invention enables the equalization times of the read data bus and the write data bus to be separately optimized, so that the equalization time of the read data bus can be lengthened without lengthening the equalization time of the write data bus, thus without shortening the write driving time. The result is that the memory is able to operate at higher clock frequencies than if the column control clock signal were to be generated in the same way during both read and write operations.

DETAILED DESCRIPTION OF THE INVENTION

Figure 1:
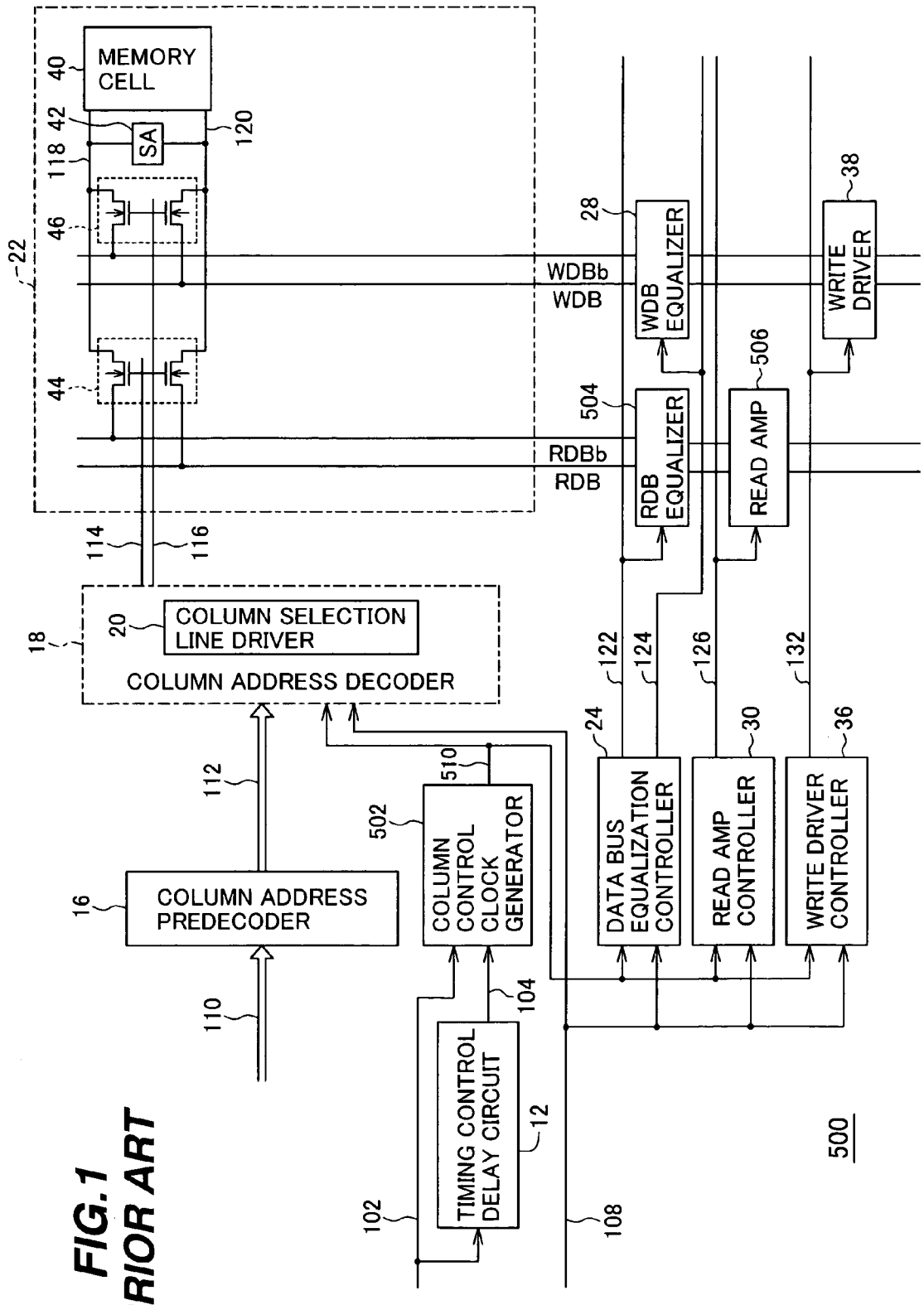
FIG. 1 is a block diagram schematically illustrating a conventional synchronous semiconductor memory device.
Figure 2:
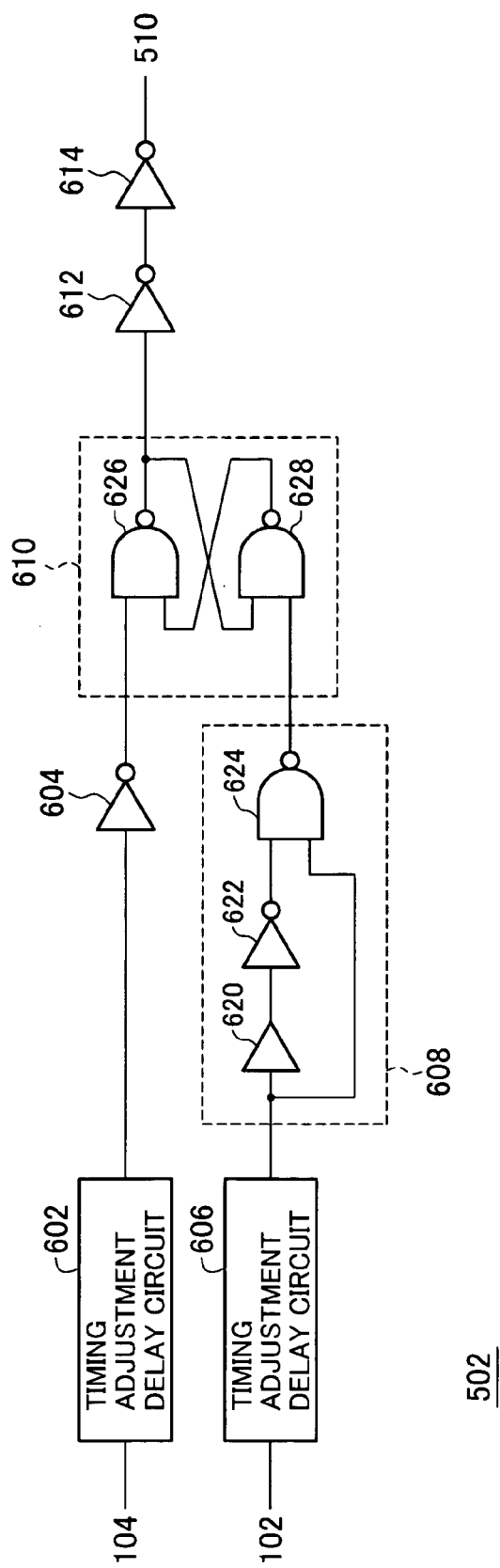
FIG. 2 is a block diagram showing details of the column control clock signal generating circuit in FIG. 1.

A synchronous semiconductor memory device embodying the invention will now be described with reference to the attached drawings, in which like elements are indicated by like reference characters. Elements not relevant to the invention are omitted from the drawings. Signals and the signal lines on which they are carried will be identified by the same reference numerals.

Figure 4:
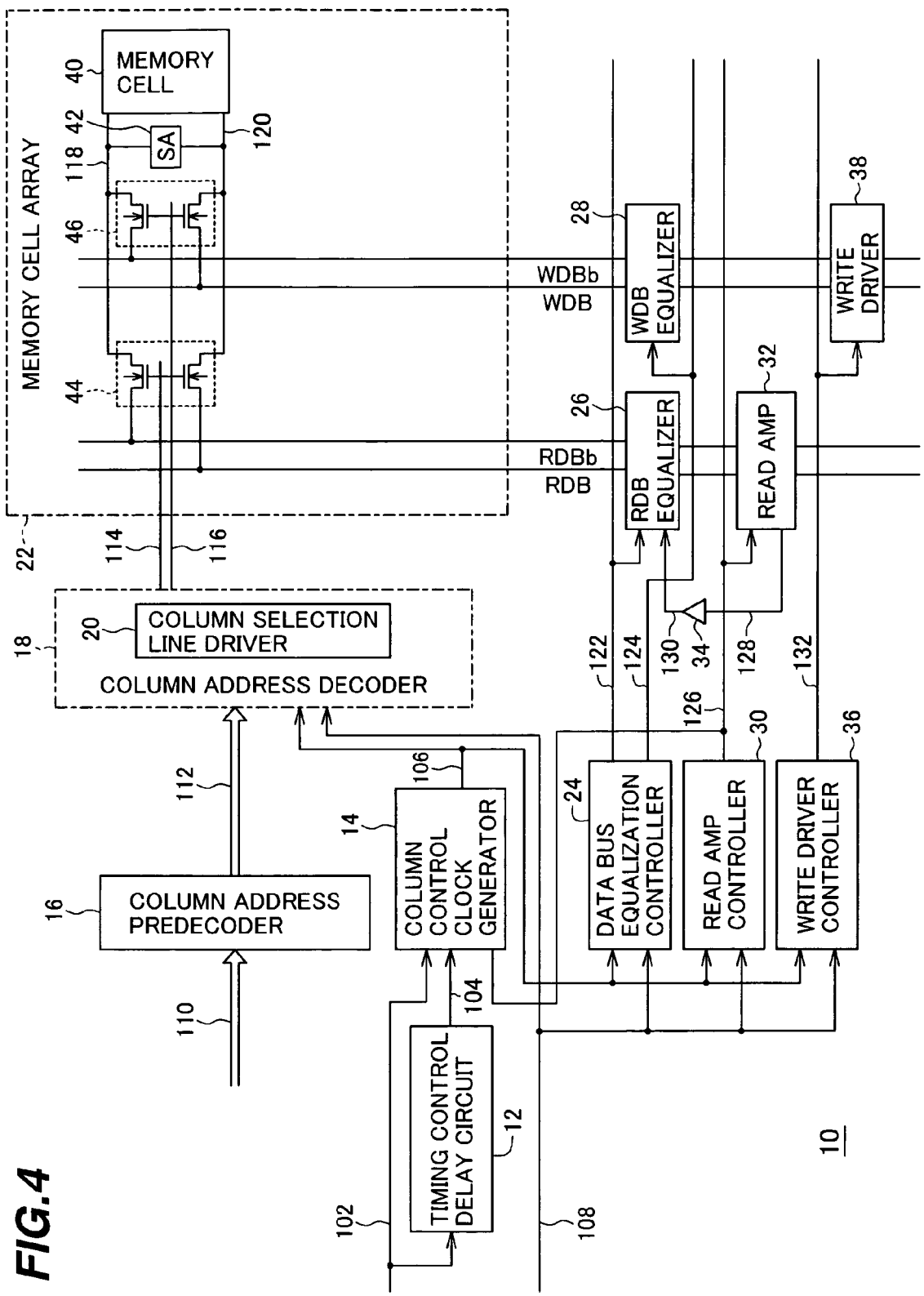
FIG. 4 is a block diagram schematically illustrating a synchronous semiconductor memory device embodying the present invention.

Referring to FIG. 4, like the conventional synchronous semiconductor memory device 500, the invented synchronous semiconductor memory device 10 operates in accordance with a clock signal 102, a read signal 108, and a column address signal 110. The clock signal 102 is supplied from an external source, and is used to synchronize all operations of the synchronous semiconductor memory device 10. The read signal 108, which is high during read operations and low during write operations, is typically generated from external command input signals. The column address signal 110 is generated from an external address input signal.

The synchronous semiconductor memory device 10 has a timing control delay circuit 12 and a column control clock generator 14 that receive the clock signal 102 and generate a column control clock signal 106. A column address predecoder 16 and a column address decoder 18 decode the column address signal 110 to select a column in a memory cell array 22. A column selection line driver 20 in the column address decoder 18 drives a pair of column selection signals 114, 116 to connect the selected column to a pair of read data bus lines (RDB, RDBb) and a pair of write data bus lines (WDB, WDBb). Data bus lines RDBb and WDBb carry data complementary to the data on data bus lines RDB and WDB. A data bus equalization controller 24, a read data bus equalizer 26, and a write data bus equalizer 28 equalize the bus lines. A read amplifier controller 30 and read amplifier 32 amplify data read onto the read data bus lines. The read data bus equalizer 26 and read amplifier 32 are interconnected through a buffer 34. A write driver controller 36 and a write driver 38 write data into the memory cell array 22 through the write data bus lines.

A particular feature of this embodiment is that the column control clock generator 14 receives the read amplifier control signal 126 output by the read amplifier controller 30. Another feature is that the read amplifier outputs an amplification completion signal 128, and the read data bus equalizer 26 receives this signal through the buffer 34.

There is a separate pair of column selection signals 114, 116 for each column in the memory cell array 22, there may be a plurality of pairs of read data bus lines RDB, RDBb and write data bus lines WDB, WDBb, and the memory cell array 22 may be divided into a plurality of banks, but for simplicity, only one pair of column selection signals 114 and 116, one pair of read data bus lines, one pair of write data bus lines, and one memory bank are shown in FIG. 4.

The circuit blocks in FIG. 4 will now be described in more detail.

The timing adjustment delay circuit 12 delays the clock signal 102 for a certain time to generate a delayed clock signal 104. The timing adjustment delay circuit 12 may comprise, for example, a delay locked loop or a phase locked loop.

The column control clock generator 14 generates the column control clock signal 106 in response to the clock signal 102, the delayed clock signal 104, and the read amplifier control signal 126. The column control clock signal 106 is supplied to the column address decoder 18, the data bus equalization controller 24, the read amplifier controller 30, and the write driver controller 36.

Figure 5:
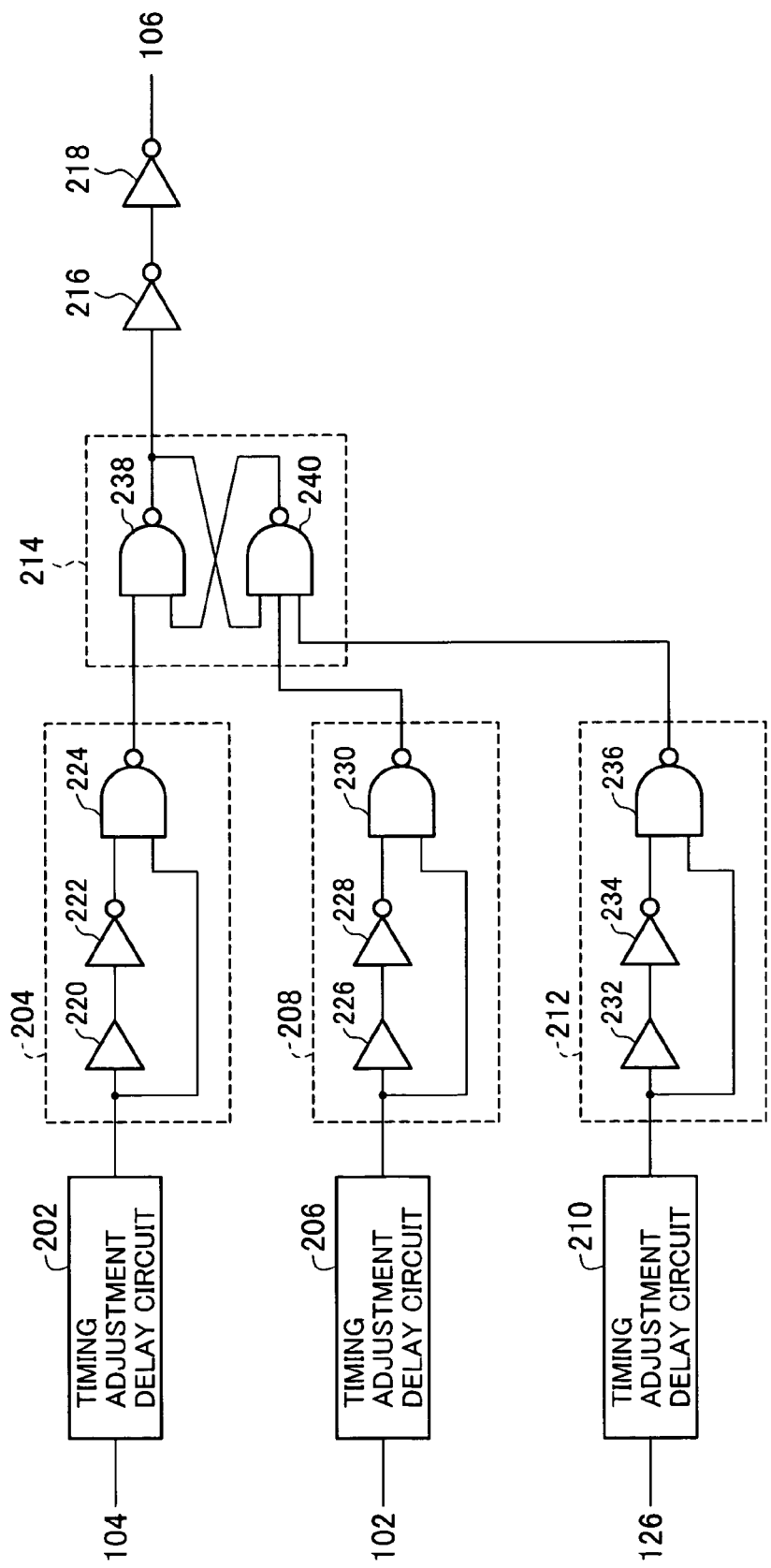
FIG. 5 is a block diagram showing details of the column control clock signal generating circuit in FIG. 4.

As shown in FIG. 5, in the column control clock generator 14, the delayed clock signal 104 is processed by a timing adjustment delay circuit 202 and a one-shot pulse generator 204, the clock signal 102 by a timing adjustment delay circuit 206 and a one-shot pulse generator 208, and the read amplifier control signal 126 by a timing adjustment delay circuit 210 and a one-shot pulse generator 212. The timing adjustment delay circuits 202, 206, and 210 adjust the delayed clock signal 104, clock signal 102, and read amplifier control signal 126 to desired timings and output the adjusted signals to the one-shot pulse generators 204, 208, and 212. Triggered by the rising edges of the adjusted signals, the one-shot pulse generators 204, 208, and 212 output one-shot low-going pulse signals to a set-reset (RS) flip-flop 214. The RS flip-flop 214 operates in response to these one-shot pulse signals to generate the column control clock signal 106, which is output through a cascaded pair of inverters 216, 218.

One-shot pulse generator 204 comprises a buffer 220, an inverter 222, and a two-input NAND gate 224; one-shot pulse generator 208 comprises a buffer 226, an inverter 228, and a two-input NAND gate 230; one-shot pulse generator 212 comprises a buffer 232, an inverter 234, and a two-input NAND gate 236. The RS flip-flop 214 comprises a two-input NAND gate 238 cross-coupled with a three-input NAND gate 240. The column control clock signal 106 is obtained from the two-input NAND gate 238. The low-going pulse signal output by one-shot pulse generator 204 is supplied to an input terminal of this NAND gate 238 to set the RS flip-flop 214; the pulse signals output by one-shot pulse generators 208 and 212 are supplied to input terminals of the three-input NAND gate 240 to reset the RS flip-flop 214. Each rising edge of the delayed clock signal 104 drives the column control clock signal 106 from the low logic level to the high logic level. Each rising edge of the clock signal 102 and the read amplifier control signal 126 drives the column control clock signal 106 from the high logic level to the low logic level.

Referring again to FIG. 4, the column address predecoder 16 decodes the column address signal 110 to generate a predecoded address signal 112 for the column address decoder 18. The predecoded address signal 112 may include separate address signals for separate columns in the memory cell array 22.

The column address decoder 18 decodes the predecoded address signal 112 and the read signal 108 in synchronization with the column control clock signal 106 to generate column selection signals for selecting the memory cells in the memory cell array 22. More specifically, the column address decoder 18 generates a read column selection signal 114 by delaying the column control clock signal 106 when the read signal 108 is high, and a write column selection signal 116 by delaying the column control clock signal 106 when the read signal 108 is low. The column selection line driver 20 outputs the column selection signals on the selected read and write column selection lines 114, 116.

The memory cell array 22 comprises a plurality (a large number, in general) of memory cells 40 that store data. For simplicity, only one memory cell is shown in FIG. 4. The memory cell 40 is connected through a pair of bit lines 118, 120 to a sense amplifier 42. The bit lines 118, 120 are connected through a read column selection gate 44 comprising a pair of n-channel transistors to the read data bus lines RDB, RDBb, and through a write column selection gate 46 comprising another pair of n-channel transistors to the write data bus lines WDB, WDBb.

The read column selection gate 44 is controlled by the signal on the read column selection line 114. When turned on, the read column selection gate 44 sends data read from the memory cell 40 and amplified by the sense amplifier 42 to the pair of read data bus lines RDB, RDBb. The write column selection gate 46 is controlled by the signal on the write column selection line 116. When turned on, the write column selection gate 46 sends data from the pair of write data bus lines WDB, WDBb to the selected memory cell 40.

The data bus equalization controller 24 generates a read equalization signal 122 and a write equalization signal 124 in delayed synchronization with the column control clock signal 106 and according to the logic level of the read signal 108. The read equalization signal 122 controls the read data bus equalizer 26; the write equalization signal 124 controls the write data bus equalizer 28.

The read data bus equalizer 26 equalizes the potentials on the pair of read data bus lines RDB, RDBb in response to the read equalization signal 122 and an amplification completion signal 130 received from the buffer 34. Equalization starts when both of these signals 122, 130 are active and continues until the read equalization signal 122 becomes inactive. Internal details of the read data bus equalizer 26 will be described later.

The write data bus equalizer 28 equalizes the potentials on the pair of write data bus lines WDB, WDBb. Equalization starts when the write equalization signal 124 becomes active and ends when the write equalization signal 124 becomes inactive.

The read amplifier controller 30 generates the read amplifier control signal 126 in synchronization with the column control clock signal 106 and according to the logic level of the read signal 108, to control the read amplifier 32. When the read signal 108 is low, the read amplifier controller 30 leaves the read amplifier control signal 126 at the inactive (low) level. When the read signal 108 is high, the read amplifier controller 30 drives the read amplifier control signal 126 to the active (high) level at a timing delayed from the rise of the column control clock signal 106 by an amount sufficient to allow the potentials on the read data bus lines RDB and RDBb to diverge, holds the read amplifier control signal 126 at the active level long enough to allow the read amplifier 32 to operate, and then returns the read amplifier control signal 126 to the inactive level. The read amplifier controller 30 also sends the read amplifier control signal 126 to the column control clock generator 14.

The read amplifier 32 amplifies the data (i.e., the potential difference) on the read data bus lines RDB and RDBb, and outputs a pair of amplified read data signals RSAOUT, RSAOUTb. The read amplifier 32 also generates an amplification completion signal 128 that goes high when amplification has proceeded far enough that input of the data from the read data bus lines is no longer required. Amplification takes place when the read amplifier control signal 126 is active.

Figure 6:
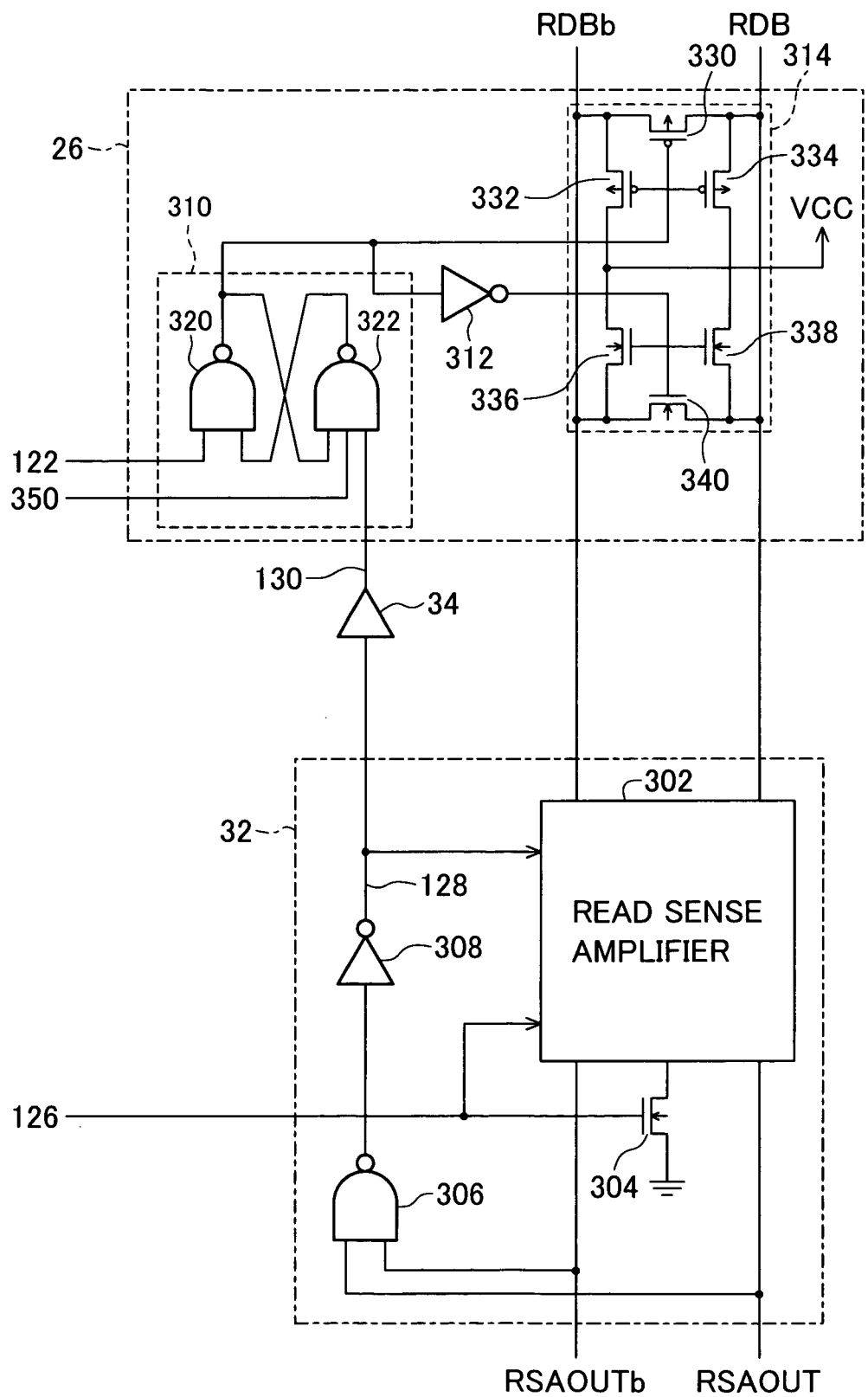
FIG. 6 is a block diagram showing details of the read amplifier and read data bus equalizer in FIG. 4.

Referring to FIG. 6, the read amplifier 32 includes a read sense amplifier 302, an n-channel transistor 304, a two-input NAND gate 306, and an inverter 308.

The read sense amplifier 302 detects and amplifies the potential difference between the read data bus lines RDB and RDBb, and outputs the amplified read data signals RSAOUT, RSAOUTb. The read sense amplifier 302 also receives the amplification completion signal 128, which controls a pair of n-channel transistors (not shown) that disconnect the read sense amplifier 302 from the read data bus lines RDB, RDBb when the amplification completion signal 128 is active (low).

The n-channel transistor 304 receives the read amplifier control signal 126 at its gate terminal. The drain terminal of the n-channel transistor 304 is connected to the read sense amplifier 302; the source terminal of the read sense amplifier 302 is connected to ground. The n-channel transistor 304 turns off when the read amplifier control signal 126 is inactive (low) and turns on, permitting amplification to proceed in the read sense amplifier 302, when the read amplifier control signal 126 is active (high).

The two-input NAND gate 306 carries out a NAND operation on the pair of amplified output signals, RSAOUT, RSAOUTb. These signals RSAOUT, RSAOUTb are equalized to the power supply level at the start of each read cycle, by an equalization circuit not shown in the drawings, causing the output of the NAND gate 306 to go low. When the read sense amplifier 302 detects a potential difference on the read data bus lines RDB, RDBb, one of the output signals RSAOUT, RSAOUTb begins to fall. When this output signal reaches the switching point of the NAND gate 306, the output of the NAND gate 306 goes high.

The inverter 308 inverts the output of the NAND gate 306 to generate the amplification completion signal 128. The amplification completion signal 128 thus becomes active (goes low), disconnecting the read sense amplifier 302 from the read data bus RDB, RDBb, when the amplification process has proceeded to the switching point of NAND gate 306, and returns to the inactive (high) level when the output signals RSAOUT and RSAOUTb are equalized at the start of the next read or write cycle. The amplification completion signal 128 is also supplied to the buffer 34, and is output from the buffer 34 as the amplification completion signal 130. The amplification completion signal 130 thus becomes active (low) when the potentials of the amplified read data signals RSAOUT, RSAOUTb have diverged sufficiently, and remains active until the end of the read cycle.

The read data bus equalizer 26 comprises an RS flip-flop 310, an inverter 312, and an equalization circuit 314. The RS flip-flop 310, which comprises a cross-coupled pair of NAND gates 320, 322, generates a control signal that controls the equalization circuit 314. NAND gate 320 receives the read equalization signal 122 and outputs the control signal; NAND gate 322 receives the amplification completion signal 130 and a power approbation signal 350. The power approbation signal 350 is initially low when the power of the synchronous semiconductor memory device 10 is turned on, and goes high when all the power levels in the synchronous semiconductor memory device 10 become stable. Accordingly, provided the power levels in the synchronous semiconductor memory device 10 are stable, the RS flip-flop 310 provides the equalization circuit 314 with a control signal that goes low when the read equalization signal 122 is high and the read data have been sufficiently amplified, and goes high when the read equalization signal 122 goes low.

The inverter 312 inverts the control signal output from the RS flip-flop 310 to generate a complementary control signal. The equalization circuit 314 comprises p-channel transistors 330, 332, 334 controlled by the control signal and n-channel transistors 336, 338, 340 controlled by the complementary control signal. The equalization circuit 314 is connected to the power supply potential VCC and equalizes the potential on the read data bus lines RDB and RDBb to the VCC level while the control signal output by the RS flip-flop 310 is low.

Referring again to FIG. 4, the write driver controller 36 generates a write driver control signal 132 that controls the write driver 38 in delayed synchronization with the column control clock signal 106 and in response to the logic level of the read signal 108. The write driver controller 36 holds the write driver control signal 132 at the inactive (low) level when the read signal 108 is high. When the read signal 108 is low, the write driver controller 36 drives the write driver control signal 132 to the active (high) level at a predetermined delay from each high-to-low transition of the column control clock signal 106, and to the inactive (low) level at a similar delay from each low-to-high transition of the column control clock signal 106.

The write driver 38 sends write data via the pair of write data bus lines WDB, WDBb to the memory cell array 22. The write driver 38 drives the voltages of the write data bus lines to complementary logic levels to write data in a memory cell 40 when the write driver control signal 132 is in the active (high) state.

Next, the operation of the synchronous semiconductor memory device 10 will be described with reference to the timing diagram in FIG. 7. The operation is synchronized with the clock signal 102, which has a cycle time designated $t_{CYC}$ and is driven from low to high at times t1, t2, t3, and t4.

The low-to-high transition of the clock signal 102 at time t1 resets the column control clock signal 106 to the low logic level. The read signal 108 is low, so the synchronous semiconductor memory device 10 begins a write cycle. The column control clock signal 106 and the low read signal 108 are input to the column address decoder 18, data bus equalization controller 24 and write driver controller 36, which respond to the fall of the column control clock signal 106 with a predetermined delay as follows at time t5: the column selection line driver 20 in the column address decoder 18 deactivates the write column selection signal 116; the read amplifier 32 deactivates the write driver control signal 132; the data bus equalization controller 24 activates the write equalization signal 124. Equalization of the pair of write data bus lines WDB, WDBb now begins.

The timing control delay circuit 12 drives the delayed clock signal 104 to the high logic level with a predetermined delay (dif1) from the rise of the clock signal 102. In the drawing, this delay dif1 coincidentally has a length that causes the delayed clock signal 104 to go high at time t5, together with the transitions of the write column selection signal 116, write equalization signal 124, and write driver control signal 132. The delayed clock signal 104 has the same cycle time $t_{CYC}$ as the clock signal 102, and is driven low with the same delay (dif1) from the fall of the clock signal 102. In the column control clock generator 14, the rise of delayed clock signal 104 at time t5 sets RS flip-flop 214, causing the column control clock signal 106 to go high after a slight delay, at time t6.

Since the read signal 108 is low, the column address decoder 18 responds to the rise of the column control clock signal 106 at time t6 by selecting a column in the memory cell array 22 and driving the corresponding write column selection signal 116 to the high logic level with the predetermined delay, at time t7. The high write column selection signal 116 turns on the transistors in the write column selection gate 46, connecting the pair of write data bus lines WDB, WDBb to a memory cell in the selected column.

Similarly, the data bus equalization controller 24 reacts to the rise of the column control clock signal 106 at time t6 by dropping the write equalization signal 124 to the low logic level at time t7, ending the equalization of the write data bus lines WDB, WDBb, and the write driver controller 36 reacts to the rise of the column control clock signal 106 at time t6 by raising the write driver control signal 132 to the high logic level at time t7. The write driver 38 now drives the pair of write data bus lines WDB, WDBb to complementary logic levels, to write data into the connected memory cell. The clock signal 102 and delayed clock signal 104 go low during this write operation.

When the clock signal 102 next goes high at time t2, the RS flip-flop 214 in the column control clock generator 14 is reset and drives the column control clock signal 106 to the low logic level at time t8. Shortly thereafter, the read signal 108 goes high at time t9, in response to external command signal input and the rise of the clock signal 102 at time t2.

At time t10, in response to the fall of the column control clock signal 106 at time t8, the column address decoder 18 deactivates the write column selection signal 116, the write driver controller 36 deactivates the write driver control signal 132, and the data bus equalization controller 24 activates write equalization signal 124. As a result, the transistors in the write column selection gate 46 are turned off, disconnecting the write data bus lines WDB, WDBb from the memory cell array 22, the write driver 38 stops driving the write data bus lines, and the write data bus equalizer 28 starts equalizing the write data bus lines. These operations terminate the write cycle. Since the read signal 108 is now high, a read cycle begins.

The delayed clock signal 104 goes high in response to the rise of the clock signal 102 at time t2. The rise of the delayed clock signal 104 sets the RS flip-flop 214 in the column control clock generator 14, so the column control clock signal 106 goes high at time t11. Since the read signal 108 is now high, the column address decoder 18, data bus equalization controller 24, and read amplifier controller 30 respond to the rise of the column control clock signal 106 as follows.

The column address decoder 18 selects a column in the memory cell array 22, and the column selection line driver 20 drives the corresponding read column selection signal 114 to the high logic level after a predetermined delay, at time t12. The high read column selection signal 114 turns on the transistors in the read column selection gate 44, connecting the read data bus lines RDB, RDBb to a memory cell in the selected column.

The data bus equalization controller 24 drives the read equalization signal 122 to the low logic level after the same predetermined delay, at time t12, ending equalization of the read data bus lines RDB, RDBb. The data stored in the selected memory cell create a slight potential difference on the bit lines 118, 120. This potential difference is amplified by the sense amplifier 42 and transferred to the read data bus lines RDB, RDBb. Shortly after time t12 the potentials on the read data bus lines RDB, RDBb start to diverge, the potential on one read data bus line remaining high while the potential on the other read data bus line begins to fall, as shown in the drawing.

The read amplifier controller 30 drives the read amplifier control signal 126 to the high logic level after a longer predetermined delay, at time t13. This delay is long enough to allow the potentials on the read data bus lines RDB, RDBb to diverge to levels that can be reliably detected by the read amplifier 32. The high read amplifier control signal 126 turns on n-channel transistor 304 in the read amplifier 32, allowing amplification of the read data by the read amplifier 32 to begin. Shortly thereafter, the potentials of the amplified output signals RSAOUT, RSAOUTb begin to diverge. Since the potentials on the read data bus lines RDB, RDBb have already diverged to a certain extent, the output potentials RSAOUT, RSAOUTb diverge comparatively quickly.

The rise of the read amplifier control signal 126 at time t13 also resets the RS flip-flop 214 in the column control clock generator 14. After a slight delay, the column control clock signal 106 goes low at time t14.

The fall of the column control clock signal 106 at time t14 causes the column address decoder 18 to return the read column selection signal 114 to the low logic level at time t15, and the data bus equalization controller 24 to drive the read equalization signal 122 to the high logic level at the same time t15. The delay from time t14 to time t15 is similar to the delay from time t11 to time t12. The transistors in the read column selection gate 44 are now turned off, disconnecting the read data bus lines RDB, RDBb from the memory cell array 22.

When the potentials of the amplified output signals RSAOUT, RSAOUTb have diverged to the switching point of the two-input NAND gate 306 in the read amplifier 32, the amplification completion signal 128 goes low, disconnecting the read data bus lines RDB, RDBb from the read sense amplifier 302 in the read amplifier 32, and the amplification completion signal 130 goes low, resetting the RS flip-flop 310 in the read data bus equalizer 26. In the drawing the high-to-low transition of the amplification completion signal 130 coincidentally occurs at time t15, together with the transitions of the read column selection signal 114 and read equalization signal 122, although in practice the high-to-low transition of the read amplifier controller 30 may either precede or follow time t15. For example, the high-to-low transition of the read amplifier controller 30 might occur at time t16. In any case, once the read equalization signal 122 is high and the amplification completion signal 130 is low, the read data bus equalizer 26 starts equalizing the read data bus lines RDB, RDBb, which are disconnected from both the memory cell array 22 and the read sense amplifier 302 in the read amplifier 32.

Amplification of the read output signals RSAOUT, RSAOUTb continues while the read data bus lines RDB, RDBb are being equalized, one of the output signals RSAOUT, RSAOUTb remaining at the high logic level while the other is brought to the low logic level. Output of these logic levels is maintained until the read cycle ends at time t3. Shortly after time t3, the read output signal lines RSAOUT, RSAOUTb are equalized, and the amplification completion signal 130 returns to the high logic level at time t17.

Figure 3:
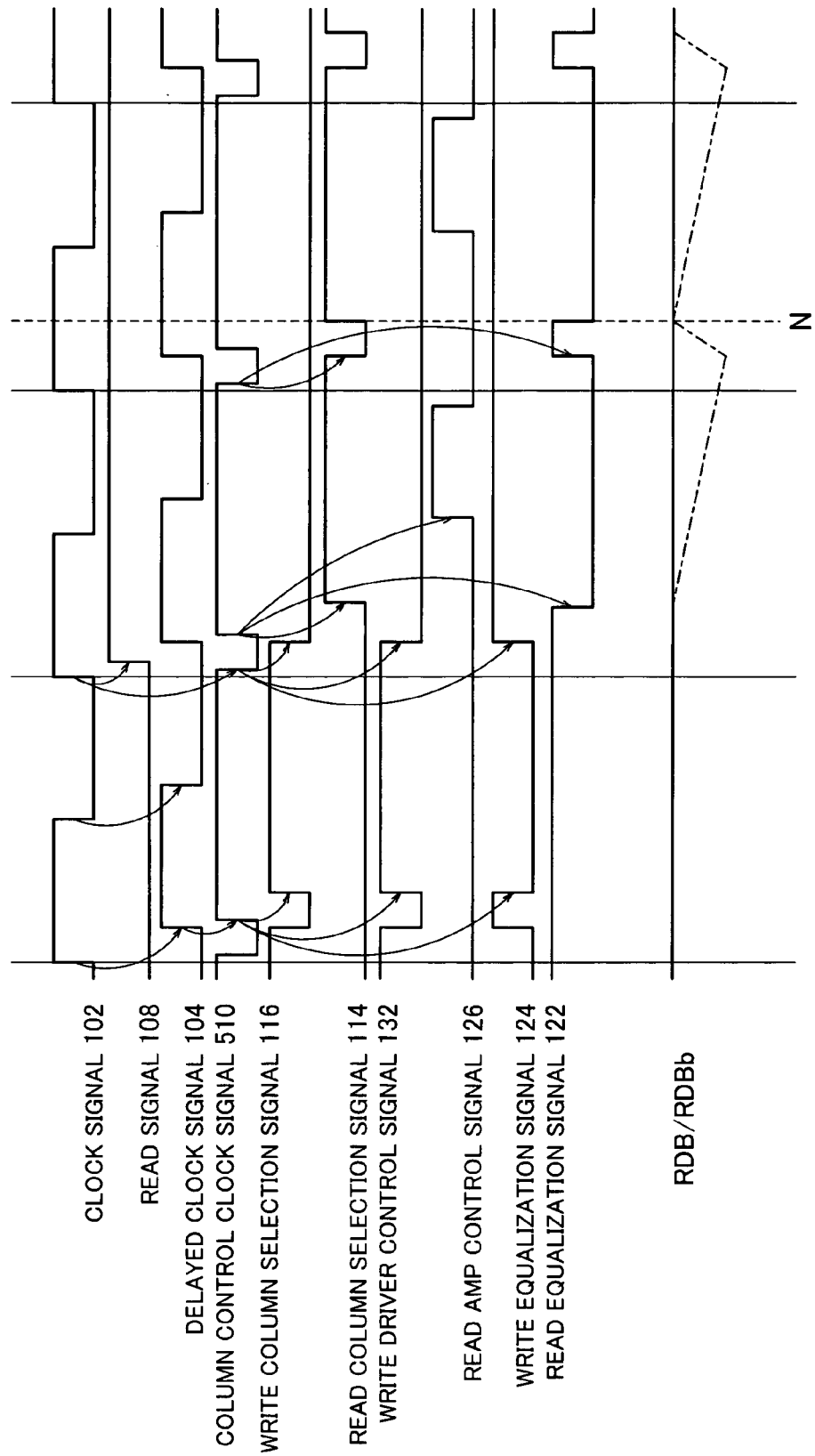
FIG. 3 is a timing diagram illustrating the operation of the synchronous semiconductor memory device in FIG. 1.

Since the read signal 108 remains high, another read cycle now begins. As equalization of the read data bus lines RDB, RDBb began at time t15 or t16, well before time t3, the read data bus equalizer 26 has ample time in which to return both read data bus lines to the high level before the next read cycle begins. The margin M from the time at which the potential difference on the read data bus lines RDB, RDBb is reduced to zero preceding time t3 to the time at which the read column selection signal 114 rises following time t3 should be compared with the non-existent margin at time N in FIG. 3.

Figure 7:
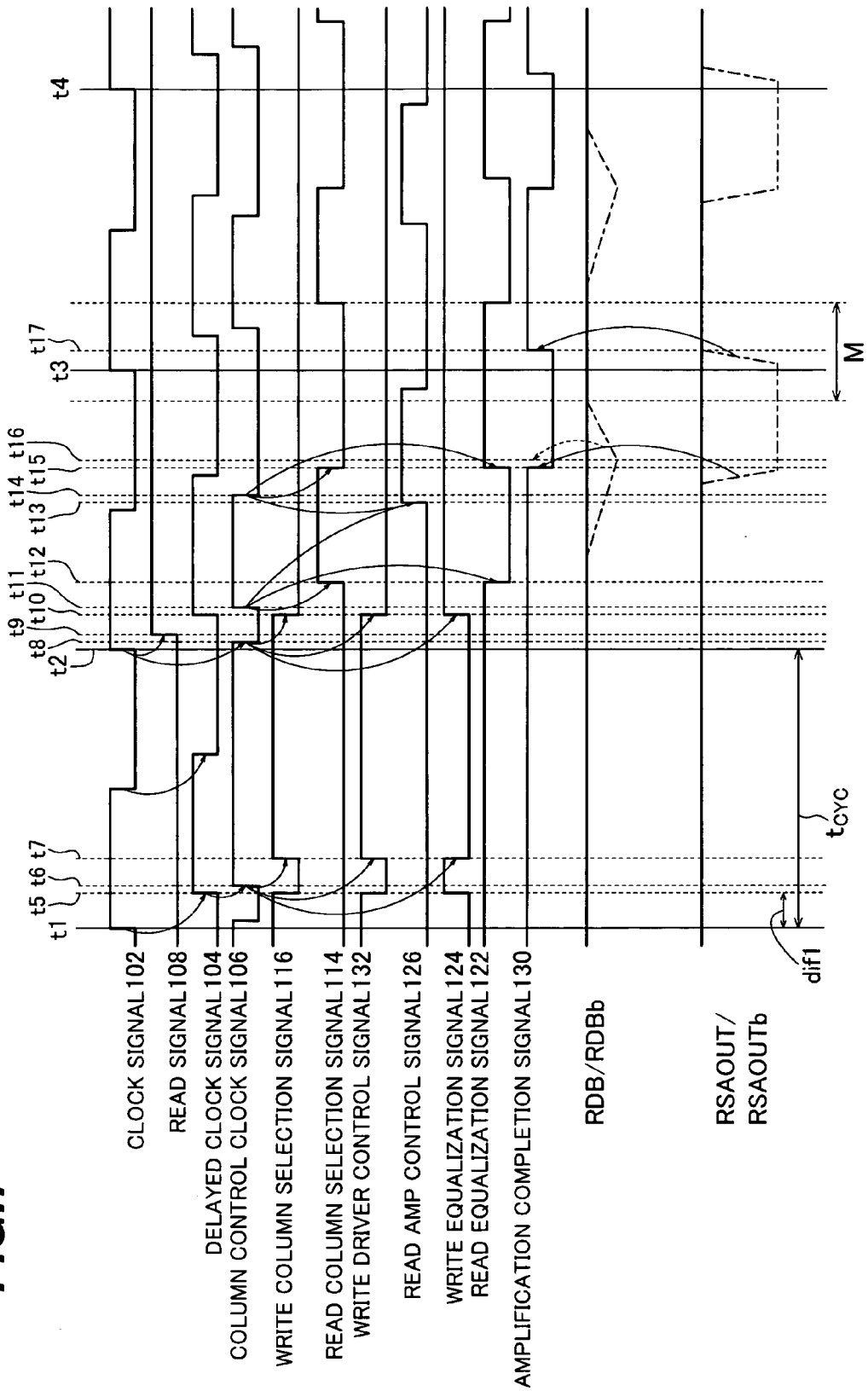
FIG. 7 is a timing diagram illustrating the operation of the synchronous semiconductor memory device in FIG. 4.

The desirable read data bus equalization margin M in FIG. 7 is moreover provided without shortening the interval from time t7 to time t10 during which the write data bus lines are driven. The reason is that whereas the column control clock signal 106 goes high in response to the rise of the delayed clock signal 104 during both read and write cycles, the column control clock signal 106 goes low in response to the rise of the clock signal 102 at the end of a write cycle, but goes low in response to the rise of the read amplifier control signal 126 before the end of a read cycle. This feature enables the present invention to generate a column control clock signal 106 that is suitable for both read and write operations, remaining high for a comparatively long time during write cycles, and a comparatively short time during read cycles.

Another feature of the embodiment described above is that the amplification completion signals 128, 130 enable the read amplifier 32 to disconnect itself from the read data bus lines RDB, RDBb as soon as amplification of the output signals RSAOUT, RSAOUTb is completed (more precisely, as soon as the amplification process becomes reliably self-sustaining), and enables the equalization of the read data bus lines RDB, RDBb to start as soon as the read data bus is disconnected from both the read amplifier 32 and the memory cell array 22. This features maximizes the equalization time and provides the largest possible equalization margin M while assuring an adequate amplification time as well.

Figure 8:
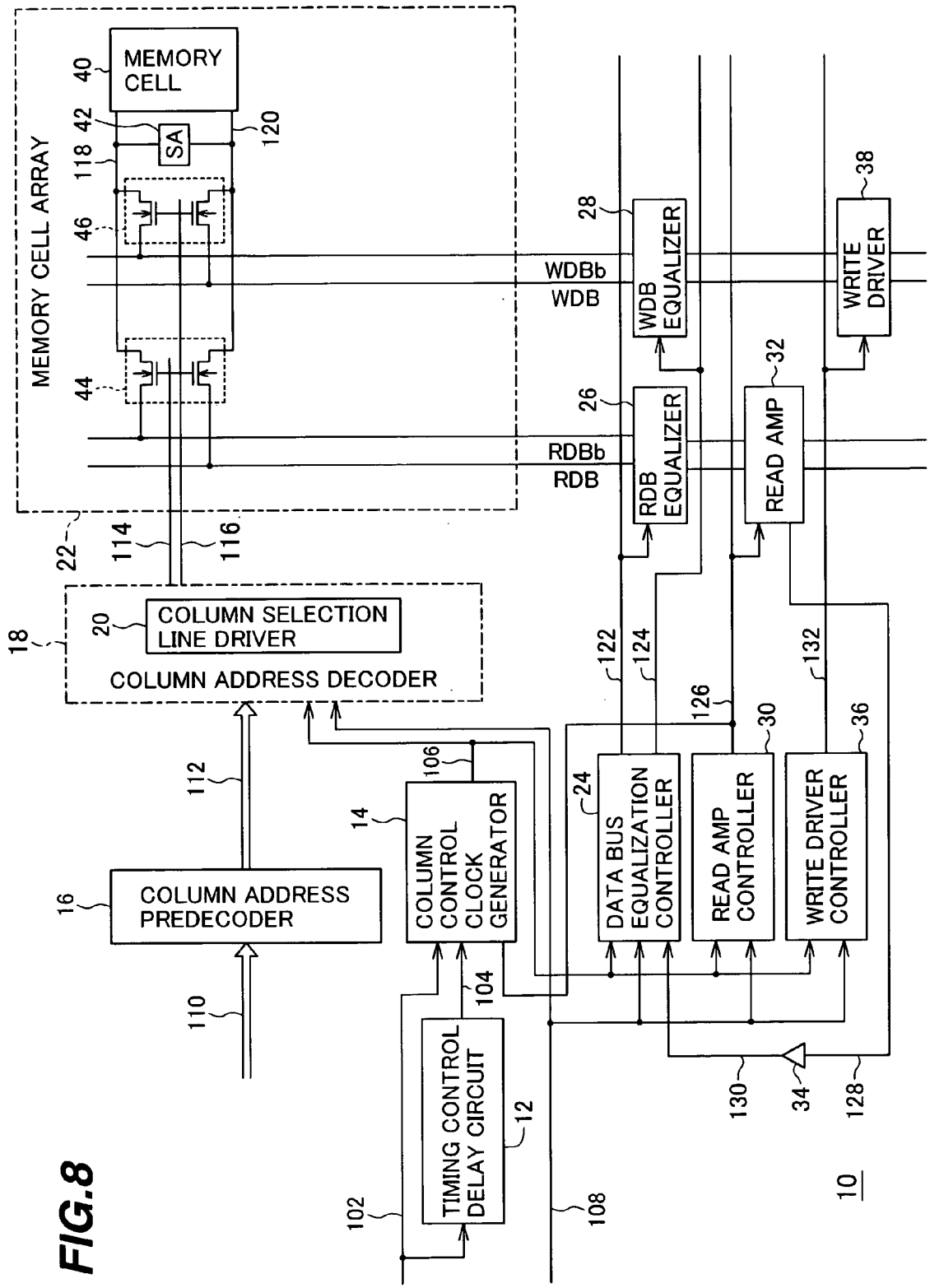
FIG. 8 is a block diagram schematically illustrating a variation of the synchronous semiconductor memory device in FIG. 4.

In a variation of the above embodiment, illustrated in FIG. 8, the amplification completion signal 130 output by the buffer 34 is routed to the data bus equalization controller 24 instead of the read data bus equalizer 26, and the data bus equalization controller 24 holds the read equalization signal 122 at the inactive level until the amplification completion signal 130 goes low. The structure of the read data bus equalizer 26 can then be simplified by use of a two-input NAND gate instead of the three-input NAND gate 322. The power approbation signal 350 may also be input to the data bus equalization controller 24, enabling a further simplification of the structure of the read data bus equalizer 26.

Figure 9:
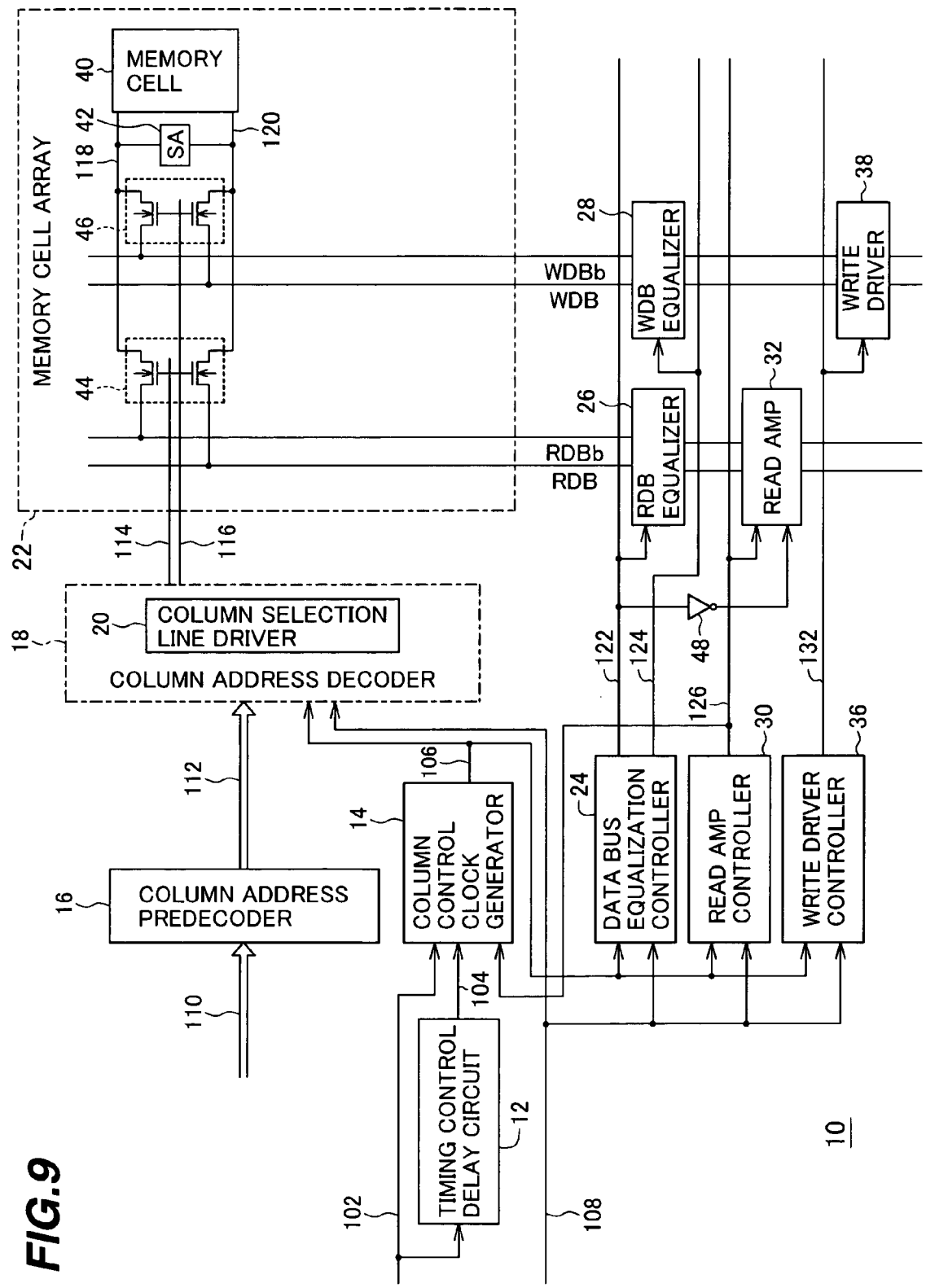
FIG. 9 is a block diagram schematically illustrating another variation of the synchronous semiconductor memory device in FIG. 4.

In another variation, illustrated in FIG. 9, the read amplifier 32 does not generate an amplification completion signal 128, the buffer 34 is eliminated, and neither the read data bus equalizer 26 nor the data bus equalization controller 24 receives an amplification completion signal 130. The read data bus equalizer 26 starts equalizing the read data bus lines RDB, RDBb when the read equalization signal 122 goes high; equalization ends when the read equalization signal 122 goes low. The read equalization signal 122 may be inverted by an inverter 48 and input to the read amplifier 32 in place of the amplification completion signal 128, to disconnect the read sense amplifier 302 from the read data bus lines while equalization is in progress. The structure of the read data bus equalizer 26 and read amplifier 32 can then be simplified, but the delay of the rise of the read equalization signal 122 from the fall of the column control clock signal 106 may need to be lengthened to ensure that equalization does not begin until the potential difference on the read data bus lines has been sufficiently amplified.

Those skilled in the art will recognize that further variations are possible within the scope of the invention, which is defined in the appended claims.

What is claimed is:

1. A synchronous semiconductor memory device in which read and write operations are synchronized to an externally supplied clock signal, comprising:
   a memory cell array including a plurality of memory cells for storing data;
   a pair of read data bus lines;
   a read column selection gate for selectively connecting the pair of read data bus lines to the memory cell array to receive the data stored in the memory cells;
   a pair of write data bus lines;
   a write column selection gate for selectively connecting the pair of write data bus lines to the memory cell array to write data into the memory cells;
   a column address decoder including a column selection signal generator for generating a read column selection signal to control the read column selection gate and a write column selection signal to control the write column selection gate;
   a read data bus equalizer for equalizing the pair of read data bus lines to mutually identical potentials;
   a write data bus equalizer for equalizing the pair of write data bus lines to mutually identical potentials;
   a data bus equalization controller including an equalizing signal generator for generating a read equalization signal to control the read data bus equalizer, and a write equalization signal to control the write data bus equalizer;
   a read amplifier for amplifying the data on the pair of read data bus lines;
   a read amplifier controller for generating a read amplifier control signal to control the read amplifier; and
   a column control clock generator for generating a column control clock signal responsive to the externally supplied clock signal and the read amplifier control signal, and supplying the column control clock signal to the column address decoder and the data bus equalization controller.

2. The synchronous semiconductor memory device of claim 1, wherein the column control clock generator comprises:

a first one-shot pulse generator generating a first pulse signal responsive to a transition of the delayed clock signal;

a second one-shot pulse generator generating a second pulse signal responsive to a transition of the externally supplied clock signal;

a third one-shot pulse generator generating a third pulse signal responsive to a transition of the read amplifier control signal; and a flip-flop circuit set to a first state by the first pulse signal, set to a second state by the second pulse signal, and set to the second state by the third pulse signal, the column control clock signal being generated as an output signal of the flip-flop circuit.

3. The synchronous semiconductor memory device of claim 1, further comprising a timing control delay circuit for delaying the externally supplied clock signal to generate a delayed clock signal and supplying the delayed clock signal to the column control clock generator, wherein:

the column control clock generator drives the column control clock signal to a first level in response to the delayed clock signal;

the column control clock generator drives the column control clock signal to a second level in response to the externally supplied clock signal to conclude a write operation; and the column control clock generator drives the column control clock signal to the second level in response to the read amplifier control signal during a read operation.

4. The synchronous semiconductor memory device of claim 3, wherein:

during a read operation, the column selection signal generator activates the read column selection signal in response to a transition of the column control clock signal from the second level to the first level to cause the read column selection gate to connect the pair of read data bus lines to the memory cell array, and deactivates the read column selection signal in response to a transition of the column control clock signal from the first level to the second level; and during a write operation, the column selection signal generator activates the write column selection signal in response to a transition of the column control clock signal from the second level to the first level to cause the write column selection gate to connect the pair of write data bus lines to the memory cell array, and deactivates the write column selection signal in response to a transition of the column control clock signal from the first level to the second level.

5. The synchronous semiconductor memory device of claim 3, wherein:

during a read operation, the data bus equalization controller activates the read equalization signal in response to a transition of the column control clock signal from the first level to the second level to enable the read data bus equalizer to equalize the pair of read data bus lines, and deactivates the read equalization signal in response to a transition of the column control clock signal from the second level to the first level; and during a write operation, the data bus equalization controller activates the write equalization signal in response to a transition of the column control clock signal from the first level to the second level to cause the write data bus equalizer to equalize the pair of write data bus lines, and deactivates the write equalization signal in response to a transition of the column control clock signal from the second level to the first level.

6. The synchronous semiconductor memory device of claim 5, wherein the read data bus equalizer starts equalizing the pair of read data bus lines when the read equalization signal becomes active.

7. The synchronous semiconductor memory device of claim 6, wherein the read amplifier receives the read equalization signal and disconnects itself from the pair of read data bus lines while the read equalization signal is active.

8. The synchronous semiconductor memory device of claim 5, wherein the read amplifier generates an amplification completion signal indicating, when active, that amplification of the data on the pair of read data bus lines has proceeded to a certain point, and disconnects itself from the pair of read data bus lines while the amplification completion signal is active.

9. The synchronous semiconductor memory device of claim 8, wherein the read amplifier generates a pair of amplified read data signals, and comprises a logic circuit for generating the amplification completion signal by performing a logic operation on the pair of amplified read data signals.

10. The synchronous semiconductor memory device of claim 8, wherein the amplification completion signal is supplied to the read data bus equalizer, and the read data bus equalizer starts equalizing the pair of read data bus lines when both the read equalization signal and the amplification completion signal are active.

11. The synchronous semiconductor memory device of claim 10, further comprising a buffer inserted between the read amplifier and the read data bus equalizer to buffer the amplification completion signal.

12. The synchronous semiconductor memory device of claim 10, wherein the read data bus equalizer comprises a flip-flop circuit controlled by the read equalization signal and the amplification completion signal, and an equalizing circuit controlled by the flip-flop circuit.

13. The synchronous semiconductor memory device of claim 12, wherein the flip-flop circuit is set by one of the read equalization signal and the amplification completion signal, and reset by another one of the read equalization signal and amplification completion signal.

14. The synchronous semiconductor memory device of claim 8, wherein the amplification completion signal is supplied to the data bus equalization controller, the data bus equalization controller waits until the amplification completion signal becomes active before activating the read equalization signal, and the read data bus equalizer starts equalizing the pair of read data bus lines when the read equalization signal becomes active.

* * * * *